(12) United States Patent
Park et al.

(10) Patent No.: US 10,497,804 B2
(45) Date of Patent: Dec. 3, 2019

(54) VERTICAL SEMICONDUCTOR DEVICE

(71) Applicant: SAMSUNG ELECTRONICS CO., LTD., Suwon-si, Gyeonggi-do (KR)

(72) Inventors: Sung-Il Park, Suwon-si (KR); Beom-Jin Park, Hwaseong-si (KR); Yun-Il Lee, Anyang-si (KR); Jung-Gun You, Ansan-si (KR); Dong-Hun Lee, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 96 days.

(21) Appl. No.: 15/670,154

(22) Filed: Aug. 7, 2017

(65) Prior Publication Data

US 2018/0248035 A1 Aug. 30, 2018

(30) Foreign Application Priority Data

Feb. 27, 2017 (KR) .................. 10-2017-0025233

(51) Int. Cl.
| | | |
|---|---|---|
| *H01L 29/78* | (2006.01) | |
| *H01L 29/788* | (2006.01) | |
| *H01L 27/11556* | (2017.01) | |
| *H01L 27/092* | (2006.01) | |
| *H01L 29/66* | (2006.01) | |
| *H01L 29/423* | (2006.01) | |
| *H01L 27/088* | (2006.01) | |
| *H01L 21/8234* | (2006.01) | |
| *H01L 27/12* | (2006.01) | |
| *H01L 27/118* | (2006.01) | |
| *H01L 27/07* | (2006.01) | |

(52) U.S. Cl.
CPC .. *H01L 29/7827* (2013.01); *H01L 21/823418* (2013.01); *H01L 21/823487* (2013.01); *H01L 27/088* (2013.01); *H01L 27/0924* (2013.01); *H01L 27/11556* (2013.01); *H01L 29/4232* (2013.01); *H01L 29/66666* (2013.01); *H01L 29/7889* (2013.01); *H01L 27/0738* (2013.01); *H01L 27/1203* (2013.01); *H01L 2027/11866* (2013.01)

(58) Field of Classification Search
CPC ............... H01L 29/7827; H01L 27/088; H01L 29/66666; H01L 29/4232; H01L 29/7889; H01L 27/0924; H01L 27/11556; H01L 2027/11866; H01L 27/1203
See application file for complete search history.

(56) References Cited

U.S. PATENT DOCUMENTS

| | | | |
|---|---|---|---|
| 8,154,076 B2 | 4/2012 | Takaishi | |
| 8,164,146 B2 | 4/2012 | Lung | |
| 8,883,594 B2 | 11/2014 | Chuang et al. | |
| 8,901,640 B2 | 12/2014 | Masuoka et al. | |
| 9,177,924 B2 | 11/2015 | Colinge et al. | |
| 9,484,424 B2 | 11/2016 | Masuoka et al. | |

(Continued)

*Primary Examiner* — Yasser A Abdelaziez
(74) *Attorney, Agent, or Firm* — Lee & Morse, P.C.

(57) ABSTRACT

A vertical transistor structure includes a first transistor and a second transistor. The first transistor includes a first lower electrode connected to a second upper electrode of the second transistor, and a second upper electrode connected to a first lower electrode of the second transistor. The first transistor also includes a gate electrode connected to a gate electrode of the second transistor.

11 Claims, 20 Drawing Sheets

(56) References Cited

U.S. PATENT DOCUMENTS

| | | | |
|---|---|---|---|
| 2006/0220134 A1* | 10/2006 | Huo | H01L 21/84 257/351 |
| 2009/0321804 A1* | 12/2009 | Mauder | H01L 29/407 257/300 |
| 2010/0117156 A1 | 5/2010 | Tsutsui et al. | |
| 2010/0207201 A1* | 8/2010 | Masuoka | H01L 27/0207 257/329 |
| 2012/0025324 A1* | 2/2012 | Takaishi | H01L 21/823487 257/390 |
| 2014/0054711 A1 | 2/2014 | Chuang et al. | |
| 2014/0256102 A1* | 9/2014 | Chuang | H01L 29/66356 438/268 |
| 2015/0171032 A1* | 6/2015 | Colinge | H01L 23/60 257/355 |

\* cited by examiner

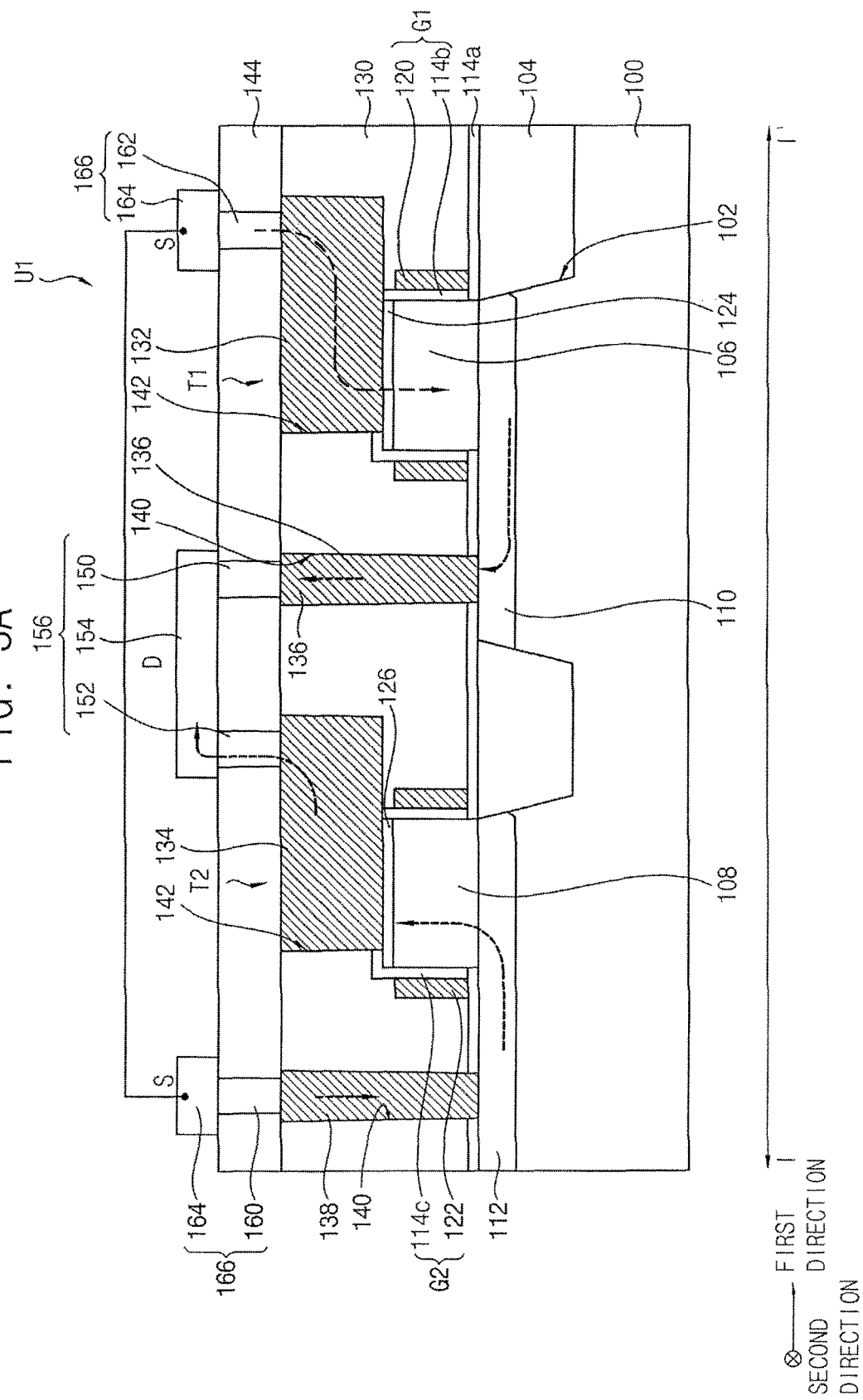

VERTICAL SEMICONDUCTOR DEVICE

CROSS-REFERENCE TO RELATED APPLICATION

Korean Patent Application No. 10-2017-0025233, filed on Feb. 27, 2017, and entitled, "Vertical Semiconductor Device," is incorporated by reference herein in its entirety.

BACKGROUND

1. Field

One or more embodiments herein relate to a vertical semiconductor device.

2. Description of the Related Art

An integrated semiconductor device may include a vertical transistor. A vertical transistor has a channel formed vertically with respect to a substrate. In a vertical transistor, the source and drain respectively formed on a top and a bottom of the channel may not have a same structure. Thus, the vertical transistor may have different electrical characteristics depending on the direction in which current flows in the channel.

SUMMARY

In accordance with one or more embodiments, a semiconductor device which includes a first active fin structure and a second active fin structure on a substrate; a first gate structure on a sidewall of the first active fin structure; a second gate structure on a sidewall of the second active fin structure; a first lower electrode on the substrate on a side of the first active fin structure, the first lower electrode spaced apart from the first active fin structure; a first upper electrode on an upper surface of the first active fin structure; a second lower electrode on the substrate on a side of the second active fin structure, the second lower electrode spaced apart from the second active fin structure; a second upper electrode on an upper surface of the second active fin structure; a first interconnection structure connecting the first lower electrode and the second upper electrode; and a second interconnection structure connecting the second lower electrode and the first upper electrode.

In accordance with one or more other embodiments, a semiconductor device includes a substrate; a first fin active structure and a second active fin structure on the substrate; a first vertical transistor on the first active fin structure and the substrate, the first vertical transistor including a first gate structure, a first lower electrode and a first upper electrode; a second vertical transistor on the second active fin structure and the substrate, the second vertical transistor including a second gate structure, a second lower electrode and a second upper electrode; a first interconnection structure electrically connecting the first lower electrode and the second upper electrode; and a second interconnection structure electrically connecting the second lower electrode and the first upper electrode.

In accordance with one or more other embodiments, a vertical transistor structure includes a first transistor and a second transistor, wherein the first transistor includes a first lower electrode connected to a second upper electrode of the second transistor, the first transistor includes a second upper electrode connected to a first lower electrode of the second transistor, and the first transistor includes a gate electrode connected to a gate electrode of the second transistor.

BRIEF DESCRIPTION OF THE DRAWINGS

Features will become apparent to those of skill in the art by describing in detail exemplary embodiments with reference to the attached drawings in which:

FIGS. 1, 2, 3A, 3B, and 4 illustrate an embodiment of a semiconductor device;

DETAILED DESCRIPTION

Figure 1:
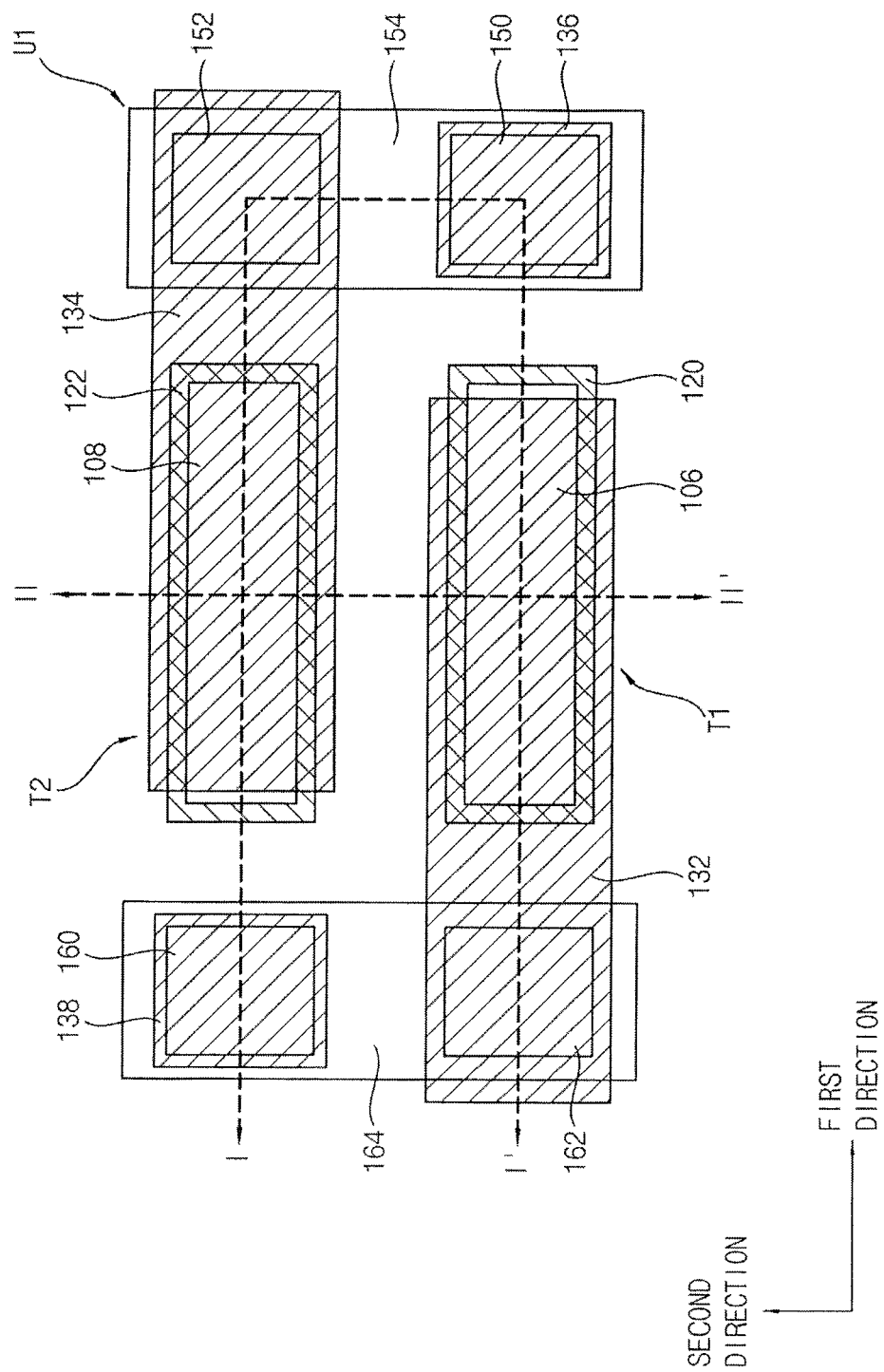
Figure 2:
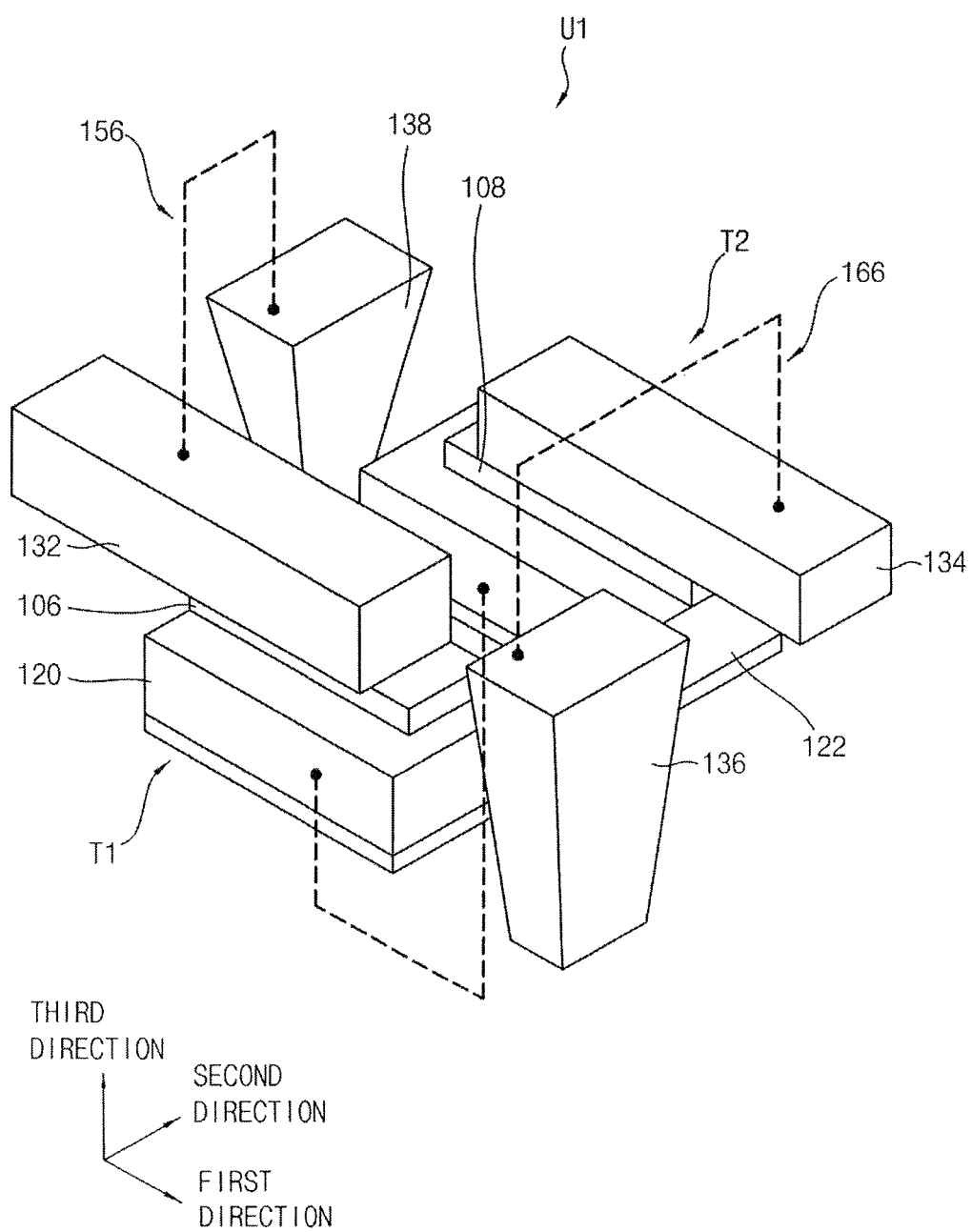
Figure 3B:
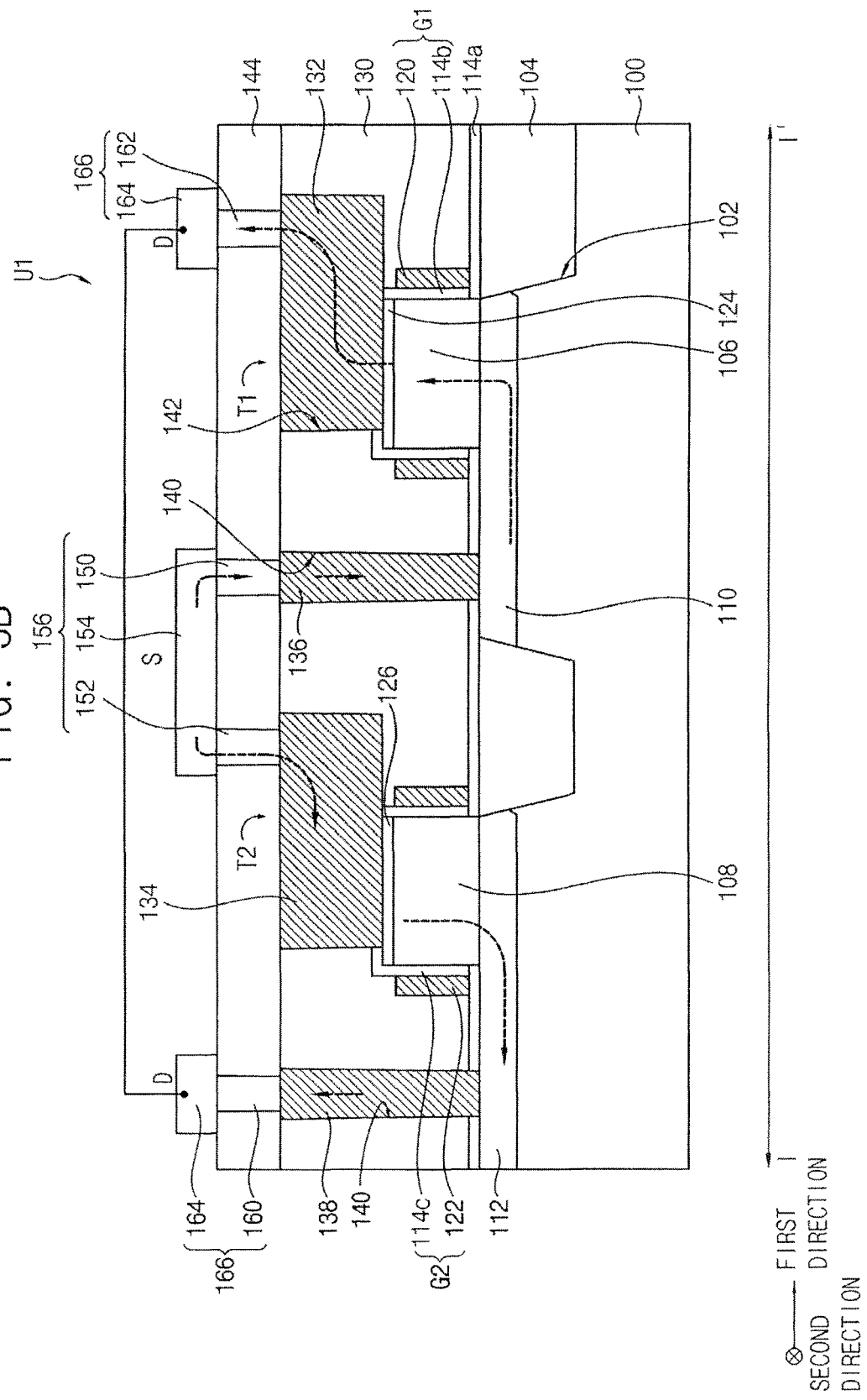
Figure 4:
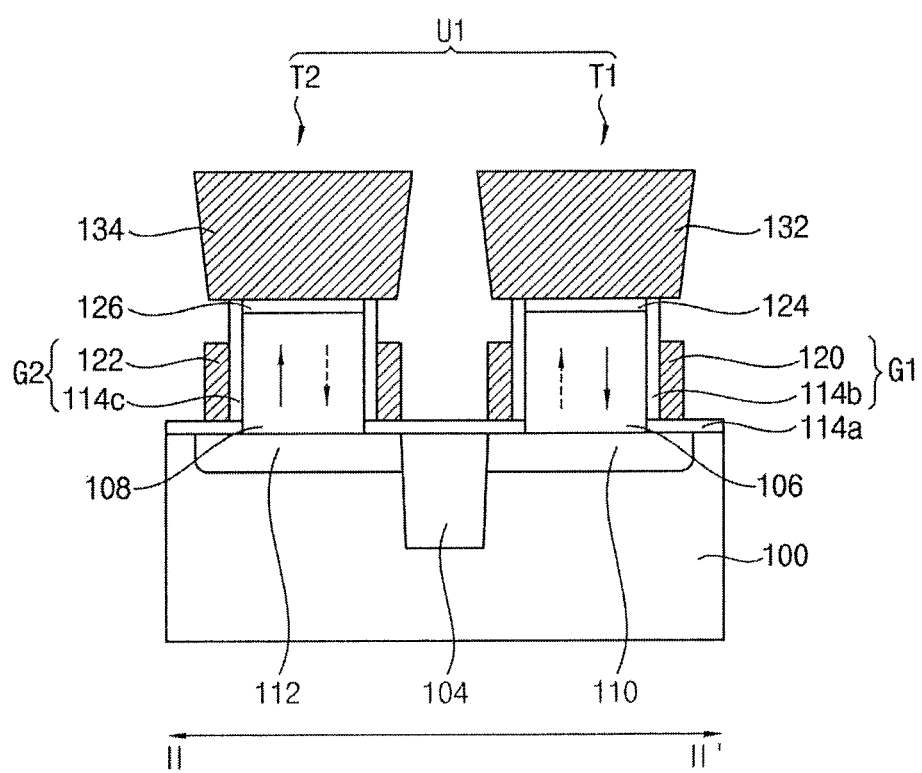
Figure 5A:
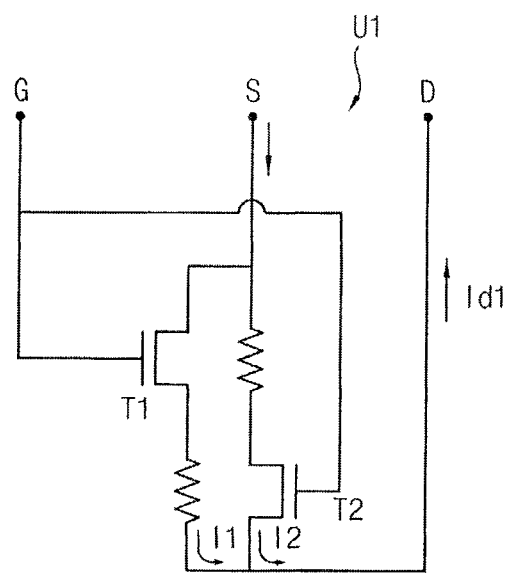
FIGS. 5A and 5B illustrate circuit embodiments of a semiconductor device.
Figure 5B:
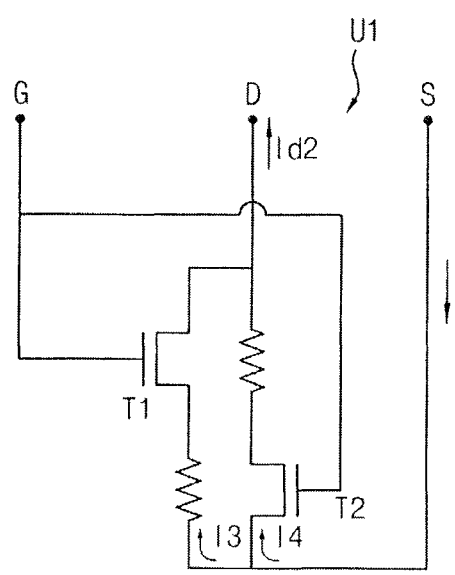

FIG. 1 illustrates a plan view, FIG. 2 illustrates a perspective view, and FIGS. 3A, 3B, and 4 illustrate cross-sectional views of an embodiment of a semiconductor device. Specifically, FIGS. 3A and 3B illustrate cross-sectional views taken along line I-I' of FIG. 1. FIG. 4 illustrates a cross-sectional view taken along line II-II' of FIG. 1. Directions parallel to an upper surface of a substrate 100 and perpendicular (or crossing) to each other may be referred to as first and second directions. A direction perpendicular (or crossing) to the upper surface of the substrate 100 may be referred to as a third direction. FIGS. 5A and 5B illustrate equivalent circuit diagrams of a semiconductor device, which, for example, may be the semiconductor device shown in FIGS. 1, 2, 3A, 3B, and 4.

Referring to FIGS. 1, 2, 3A, 3B, 4, 5A and 5B, a vertical transistor unit U1 functioning as one transistor may be on the substrate 100. The vertical transistor unit U1 may include two vertical transistors, e.g., a first vertical transistor T1 and a second vertical transistor T2. In some embodiments, the substrate 100 may include a semiconductor material such as silicon, germanium or silicon-germanium. An isolation pattern 104 may be in the substrate 100. The substrate 100 may be divided into an active region and a field region by the isolation pattern 104.

A first active fin structure 106 and a second active fin structure 108 may be on the substrate 100 and protrude in the third direction from the substrate 100. The first and second active fin structures 106 and 108 may be on the active region of the substrate 100. The first and second active fin structures 106 and 108 may have substantially the same shape.

The first and second active fin structures 106 and 108 may extend in the first direction and a pillar shape. In some embodiments, the first and second active fin structures 106 and 108 may have a predetermined shape, e.g., a rectangular parallelepiped shape. The first and second active fin structures 106 and 108 may have rounded top surfaces. The first and second active fin structures 106 and 108 may be spaced apart from each other in the second direction.

In some embodiments, the first and second active fin structures 106 and 108 may include a semiconductor material, e.g., silicon, germanium or silicon-germanium. The first and second active fin structures 106 and 108 may include the same material as or a different material from the substrate 100.

The first vertical transistor T1 may be on the first active fin structure 106 and the substrate 100. The second vertical transistor T2 may be on the second active fin structure 108 and the substrate 100.

The first vertical transistor T1 may include a first gate electrode structure G1, a first lower impurity region 110, a first upper impurity region 124, a first lower electrode 136, and a first upper electrode 132. The first gate structure G1 may be disposed on a sidewall of the first active fin structure 106.

The first gate structure G1 may surround the sidewall of the first active fin structure 106. The first gate structure G1 may have, for example, a cylindrical shape. The first gate structure G1 may include a first gate insulating pattern 114b surrounding the sidewall of the first active fin structure 106 and a first gate electrode 120 on the first gate insulating pattern 114b. A lower surface of the first gate electrode 120 may be spaced apart from the upper surface of the substrate 100. An insulating pattern 114a may be between the lower surface of the first gate electrode 120 and the upper surface of the substrate 100 in the third direction. The first active fin structure 106 may be provided as a channel region of the first vertical transistor T1.

The first lower impurity region 110 may be in a upper portion of the substrate 100 and may be doped with a first conductivity type impurity. The first lower impurity region 110 may extend in a lateral direction from a portion of the substrate 100 opposite to a lower surface of the first active fin structure 106. The isolation pattern 104 may be adjacent to an end of the first lower impurity region 110.

The first lower electrode 136 may contact the first lower impurity region 110 and may be a contact plug. The first lower electrode 136 may contact the upper surface of the substrate 100. The first lower electrode 136 may be spaced apart from the first active fin structure 106 in the first direction.

The first upper impurity region 124 may be in an upper portion of the first active fin structure 106 and may doped with the first conductivity type impurity. A lower surface of the first upper impurity region 124 may be at a higher level than an upper surface of the first gate electrode 120 relative to the upper surface of the substrate 100. In some embodiments, a portion of the first upper impurity region 124 may laterally overlap an upper portion of the first gate electrode 120.

The first upper electrode 132 may be on the upper surface of the first active fin structure 106 and may contact the upper surface of the first active fin structure 106. Thus, the first upper electrode 132 may contact an upper surface of the first upper impurity region 124.

In the first vertical transistor T1, the first upper electrode 132, and the first lower electrode 136 (or the first lower impurity region 110 and the first upper impurity region 124) may have different structures. The first upper and lower electrodes 132 and 136 (or first lower and upper impurity regions 110 and 124) may have an asymmetrical structure with respect to the first active fin structure 106. Thus, a first resistance from the first lower electrode 136 to the first active fin structure 106 may be different from a second resistance from the first upper electrode 132 to the first active fin structure 106.

In some embodiments, since the first lower electrode 136 and the first active fin structure 106 may be spaced apart from each other in the first direction, the first resistance from the first lower electrode 136 to the first active fin structure 106 may be higher than the second resistance from the first upper electrode 132 to the first active fin structure 106.

In the first vertical transistor, the first lower electrode 136 and the first upper electrode 132 may be source and drain electrodes. In some embodiments, the first lower electrode 136 may be the source electrode and the first upper electrode 132 may be drain electrode. In some embodiments, the first lower electrode 136 may be the drain electrode and the first upper electrode 132 may be the source electrode.

The second vertical transistor T2 may include a second gate structure G2, a second lower impurity region 112, a second upper impurity region 126, a second lower electrode 138, and a second upper electrode 134.

The second gate structure G2, the second lower impurity region 112, the second upper impurity region 126, the second lower electrode 138, and the second upper electrode 134 may have substantially the same structure as the first gate structure G1, the first lower impurity region 110, the first upper impurity region 124, the first lower electrode 136 and the first upper electrode 132, respectively. In some embodiments, the arrangement relationship between respective elements of the first and second transistors T1 and T2 may be different from each other.

The second gate structure G2 may be on a sidewall of the second active fin structure 108. The second gate structure G2 may surround the sidewall of the second active fin structure 108. The second gate structure G2 may include a second gate insulating pattern 114c surrounding the sidewall of the second active fin structure 108 and a second gate electrode 122 on the second gate insulating pattern 114c. A surface of the second gate electrode 122 may be spaced apart from the upper surface of the substrate 100. The insulating pattern 114a may be between a lower surface of the second gate electrode 122 and the upper surface of the substrate 100 in the third direction. The second active fin structure 108 may be provided as a channel region of the second vertical transistor T2.

The second lower impurity region 112 may be in a upper portion of the substrate 100 and doped with the first conductivity type impurity. The second lower impurity region 112 may extend in a lateral direction from a portion of the substrate 100 opposite to a lower surface of the second active fin structure 108.

When viewed in plan view, the second lower impurity region 112 and the first lower impurity region 110 may not be arranged in the second direction. The first and second lower impurity regions 110 and 112 may be arranged in an oblique direction to the second direction.

In some embodiments, when viewed in a plan view, the first lower impurity region 110 may further extend at a right side of the first active fin structure 106, and the second lower impurity region 112 may further extend at a left side of the second active fin structure 108. The isolation pattern 104 may be in the substrate 100 at a right side of the second active fin structure 108.

The second lower electrode 138 may contact the second lower impurity region 112 and may be a contact plug. The second lower electrode 138 may be spaced apart from the second active fin structure 108 in the first direction. When viewed in plan, the second lower electrode 138 and at least a portion of the first upper electrode 132 may be arranged in a line parallel to the second direction. The first upper electrode 132 may extend in the first direction.

The second upper impurity region 126 may be in a upper portion of the second active fin structure 108 and may doped with the first conductivity type impurity. A lower surface of the second upper impurity region 126 may be at a higher level than an upper surface of the second gate electrode 122 relative to the upper surface of the substrate 100. In some embodiments, a portion of the second upper impurity region 126 may laterally overlap a upper portion of the second gate electrode 122.

The second upper electrode 134 may be on an upper surface of the second active fin structure 108 and may contact the upper surface of the second active fin structure 108. The second upper electrode 134 may contact the second upper impurity region 126. When viewed in plan view, at least a portion of the second upper electrode 134 and the first lower electrode 136 may be arranged in a line parallel to the second direction. The second upper electrode 134 may extend in the first direction. In some embodiments, the first and second lower electrodes 136 and 138 may be arranged in an oblique direction to the second direction.

In some embodiments, an upper surface of the first lower electrode 136 and an upper surface of the first upper electrode 132 may be substantially coplanar with an upper surface of the second lower electrode 138 and an upper surface of the second upper electrode 134.

In the second vertical transistor T2, the second upper electrode 134 and the second lower electrode 138 (or the second lower impurity region 112 and the second upper impurity region 126) may have different structures. Thus, a third resistance from the second lower electrode 138 to the second active fin structure 108 may be different from a fourth resistance from the second upper electrode 134 to the second active fin structure 108. In some embodiments, the third resistance may be equal to the first resistance. The fourth resistance may be substantially equal to the second resistance.

A first interconnection structure 156 may be on the substrate 100 to electrically connect the first lower electrode 136 and the second upper electrode 134. Additionally, a second interconnection structure 166 may be on the substrate 100 to electrically connect the first upper electrode 132 and the second lower electrode 138.

In some embodiments, the first interconnection structure 156 may include a first contact plug 150, a second contact plug 152, and a first conductive pattern 154. The first contact plug 150 may contact the upper surface of the first lower electrode 136. The second contact plug 152 may contact the upper surface of the second upper electrode 134. The first conductive pattern 154 may connect upper surfaces of the first and second contact plugs 150 and 152. The second interconnection structure 166 may include a third contact plug 160, a fourth contact plug 162, and a second conductive pattern 164. The third contact plug 160 may contact the upper surface of the second lower electrode 138. The fourth contact plug 162 may contact the upper surface of the first upper electrode 132. The second conductive pattern 164 may connect upper surfaces of the third and fourth contact plugs 160 and 162. The first and second conductive patterns 154 and 164 may extend in the second direction.

The first and second gate electrodes 120 and 122 may be electrically connected. In some embodiments, contact plugs may be respectively disposed on the first and second gate electrodes 120 and 122, and an interconnection line may be disposed to electrically connect the contact plugs.

In the first and second vertical transistors T1 and T2, the first lower electrode 136 and the second upper electrode 134 may be electrically connected to each other to form a first electrode structure. The first upper electrode 132 and the second lower electrode 138 may be electrically connected to form a second electrode structure. The first and second gate electrodes 120 and 122 may be electrically connected to form a gate structure. Thus, the vertical transistor unit U1 including the first and second vertical transistors T1 and T2 may be provided.

First and second interlayer insulating layers 130 and 144 may be between the elements included in the vertical transistor unit U1.

In some embodiments, in the vertical transistor unit U1, the first electrode structure may be used as a source electrode and the second electrode structure may be used as a drain electrode. In other embodiments, in the vertical transistor unit U1, the first electrode may be used as a drain electrode and the second electrode structure may be used as a source electrode. In the vertical transistor unit U1, the source electrode and the drain electrode may be exchanged with each other. When the source and drain electrodes are exchanged with each other, a current flow direction through the channel region may be changed. However, electrical characteristics (e.g., operating current) may be maintained substantially the same (e.g., the output drain current may lie within a predetermined tolerance based on, for example, the intended application of the transistor structure or the requirements of a host circuit or device) irrespective of the direction of drain current flow.

Operation of the transistor unit U1 are described with reference to FIGS. 3A, 3B, 4, 5A and 5B. In the vertical transistor unit U1, a case in which the first and third resistances is greater than the second and fourth resistances are described. In a case in which the first gate structure in the vertical transistor unit U1 is used as the drain electrode, a transistor operation is described. In FIGS. 3A, 4 and 5B, the case in which the first gate structure in the vertical transistor unit U1 is used as the drain electrode is presented. In FIG. 4, an arrow direction of a solid line is a current direction.

Referring to FIGS. 3A, 4 and 5A, the first lower electrode 136 and the second upper electrode 134 may be a drain electrode D, and the second lower electrode 138 and the first upper electrode 132 may be a source electrode S.

When a gate voltage higher than a threshold voltage is applied to the first and second gate electrodes 120 and 122, the vertical transistor unit U1 may be turned on. As a result, a first drain current Id1 flows from the source electrode S to the drain electrode D. For example, a first current I1 may flow from the first upper electrode 132 to the first lower electrode 136 through the first vertical transistor T1. A second current I2 may flow from the second lower electrode 138 to the second upper electrode 134 through the second vertical transistor T2. The sum of the first and second currents I1 and I2 may be the first drain current Id1.

The first current I1 and the second current I2 may be different from each other. For example, a resistance from the source electrode S to the channel region in the first vertical transistor T1 may be less than a resistance from the source electrode S to the channel region in the second vertical transistor T2. Accordingly, a current drop from the source electrode S to the channel region, in the first vertical transistor T1, may be less than a current drop from the source electrode S to the channel region in the second vertical transistor T2. Because the current drop is smaller, a greater amount of operation current (e.g., on current) may flow. Thus, the first current I1 may be greater than the second current I2.

In one embodiment, the second electrode structure may be used as the drain electrode. In this case, a second drain current Id2 flowing in the vertical transistor unit U1 may be substantially equal to the first drain current Id1, and a direction of the second drain current Id2 may be opposite to the direction of the first drain current Id1.

In FIGS. 3A, 4, and 5B, the case in which the second gate structure in the vertical transistor unit U1 is used as the drain electrode is presented. In FIG. 4, an arrow direction of a dotted line is a current direction.

Referring to FIGS. 3B, 4 and 5B, the first lower electrode 136 and the second upper electrode 134 may be used as the source electrode S, and the second lower electrode 138 and the first upper electrode 132 may be used as the drain electrode D.

When a gate voltage higher than a threshold voltage is applied to the first and second gate electrodes 120 and 122, the vertical transistor unit U1 may be turned on. As a result, the second drain current Id2 may flow from the source electrode S to the drain electrode D. For example, a third current I3 may flow from the first lower electrode 136 to the first upper electrode 132 through the first vertical transistor T1. A fourth current I4 may flow from the second upper electrode 134 to the second lower electrode 138 through the second vertical transistor T2. The sum of the third and fourth currents I3 and I4 may be the second drain current Id2.

In this case, a resistance from the source electrode S to the channel region in the first vertical transistor T1 may be greater than a resistance from the source electrode S to the channel region, in the second vertical transistor T2. Accordingly, the third current I3 may be less than the fourth current I4. The third current I3 may be substantially equal to the second current I2. The fourth current I4 may be substantially equal to the first current I1. Accordingly, the second drain current Id2 may be substantially equal to the first drain current Id1.

According to the example embodiments, even though the source electrode S and the drain electrode D are used interchangeably in the vertical transistor unit U1, electrical characteristics of the vertical transistor unit U1 may be maintained substantially the same (e.g., the output drain current may lie within a predetermined tolerance based on, for example, the intended application of the transistor structure or the requirements of a host circuit or device) irrespective of the direction of drain current flow.

Figure 6A:
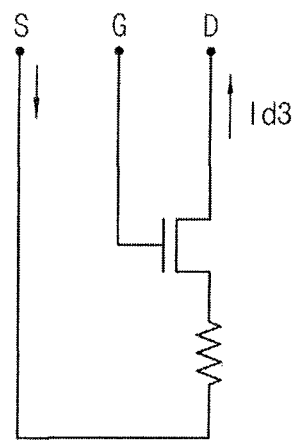
FIGS. 6A and 6B illustrate circuit diagrams of a transistor.
Figure 6B:
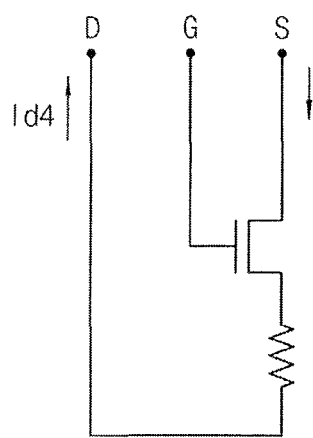

FIGS. 6A and 6B illustrate circuit diagrams of one type of a vertical transistor, which may be compared to the vertical transistor unit U1 of the present embodiment.

FIGS. 6A and 6B illustrates a vertical transistor unit formed of one vertical transistor. At ends of a gate electrode, one portion of the vertical transistor having relatively high resistance may correspond to a lower electrode. Another portion having relatively low resistance may correspond to an upper electrode.

Referring to FIG. 6A, the lower electrode may be a source electrode S and the upper electrode may be a drain electrode D. When a gate voltage greater than a threshold voltage is applied to a gate electrode G, the vertical transistor may be turned on. As a result, a third drain current Id3 may flow from the source electrode S to the drain electrode. Since a resistance form the source electrode S to a channel region is relatively high, a relatively reduced amount of third drain current Id3 may flow.

Referring to FIG. 6B, the lower electrode may be the drain electrode D and the upper electrode may be the source electrode S. When a gate voltage greater than the threshold voltage is applied to the gate electrode G, the vertical transistor may be turned on. As a result, a fourth drain current Id4 may flow from the source electrode S to the drain electrode D. Since a resistance from the source electrode to the channel region is relatively small, a greater amount of the fourth drain current Id4 may flow, e.g., greater than the third drain current Id3.

Thus, a drain current value may be varied depending on whether the lower electrode is used as the source electrode or the drain electrode. The vertical transistor may have different drain current values depending on a drain current direction. Therefore, circuit design may be restricted by asymmetry of electrical characteristics depending on the drain current direction. In accordance with one or more example embodiments, transistor unit U1 may have electrical characteristics that are symmetrical depending on the drain current direction. Thus, an improved circuit design freedom may be obtained.

FIGS. 7 to 11 are cross-sectional views illustrating an embodiment of a method for manufacturing a semiconductor device. The semiconductor device in FIGS. 7 to 11 may be the semiconductor device described, for example, in FIGS. 1 to 4. FIGS. 7 to 11 are cross-sectional views taken along line I-I' in FIG. 1.

Figure 7:
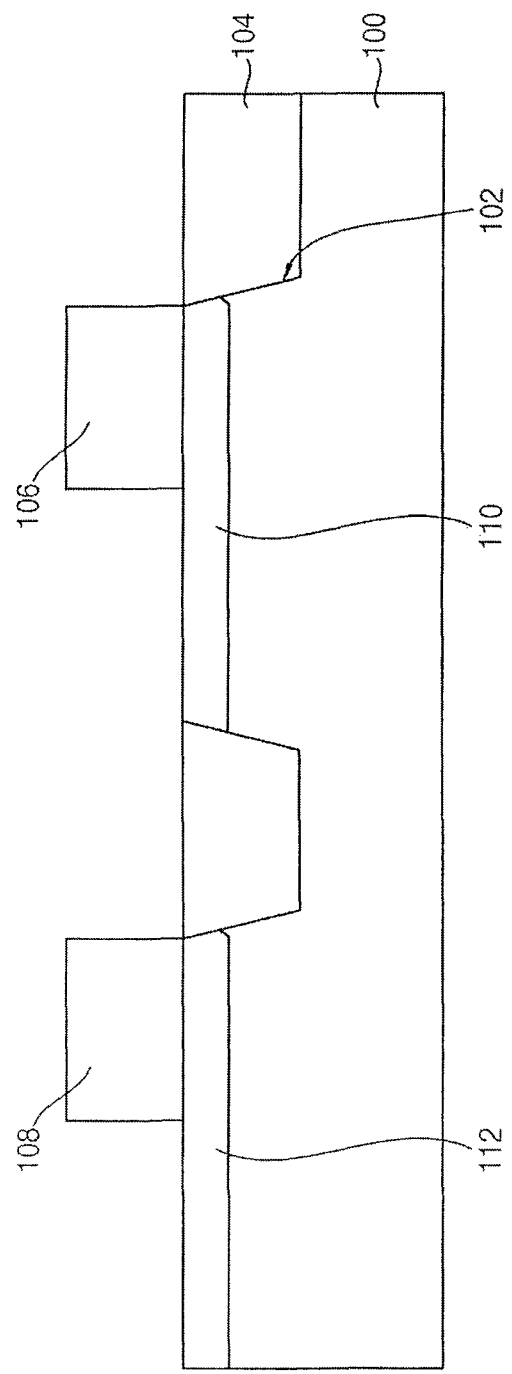
FIGS. 7 to 11 illustrate an embodiment of a method for manufacturing a semiconductor device.

Referring to FIG. 7, first and second active fin structures 106 and 108 may be on a substrate 100 and protrude from substrate 100. An isolation pattern 104 may be in the substrate 100. The substrate 100 may be doped with a first conductivity type impurity to form a first lower impurity region 110 and a second lower impurity region 112. The first lower impurity region 110 may extend laterally and face a lower surface of the first active fin structure 106. The second lower impurity region 112 may extend laterally and face a lower surface of the second active fin structure 108.

In some embodiments, the first and second active fin structures 106 and 108 may be formed, for example, by etching a portion of a bare substrate. In some embodiments, the first and second active fin structures 106 and 108 may be formed by a selective epitaxial growth process. The isolation pattern 104 may be formed, for example, by etching the substrate 100 of a field region to form a trench 102 and filling the trench 102 with an insulating material.

Figure 8:
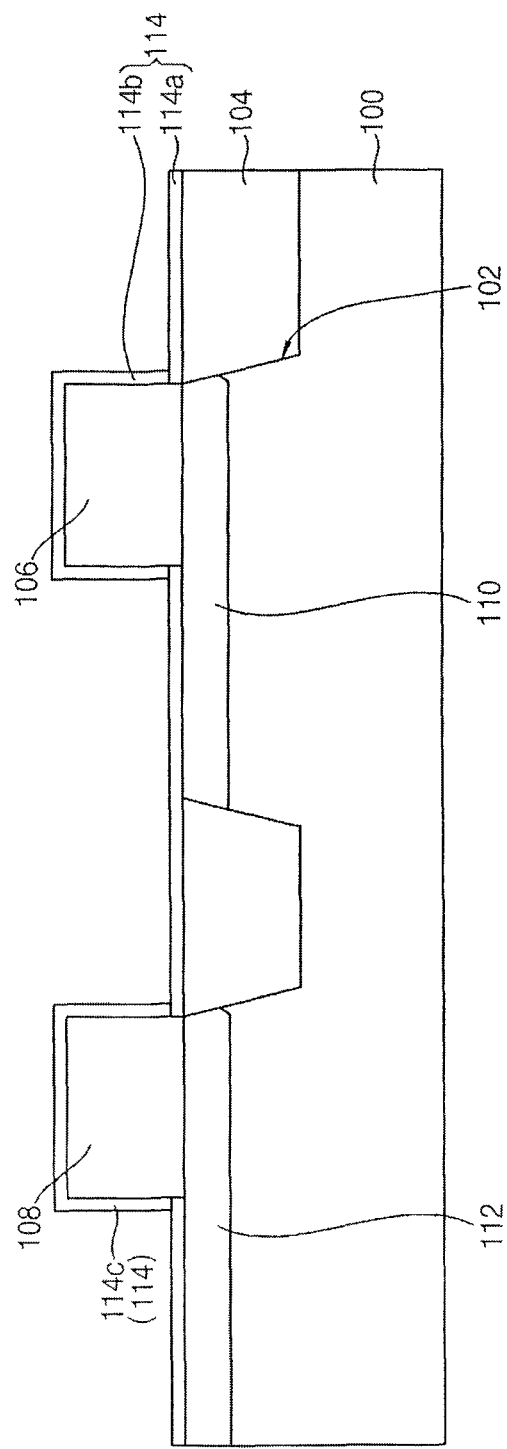

Referring to FIG. 8, an insulating layer 114 may be on surfaces of the substrate 100 and the first and second active fin structures 106 and 108. The insulating layer 114 may include silicon oxide and/or silicon nitride. In some embodiments, after forming the insulating layer 114, the insulating layer 114 may be etched to a predetermined thickness.

Figure 9:
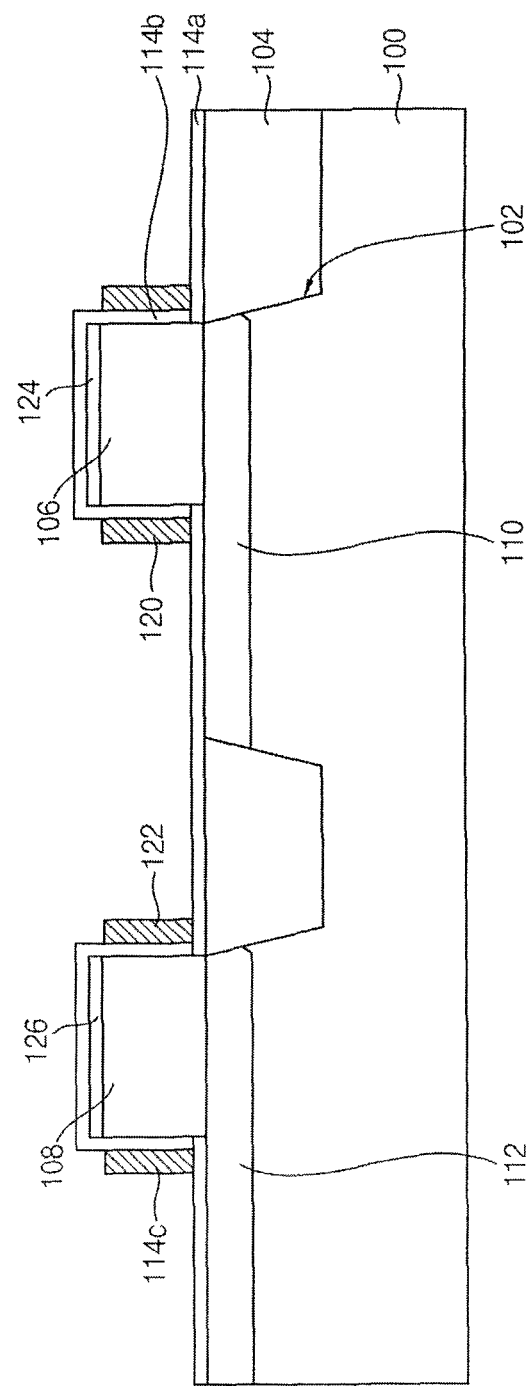

In some embodiments, the insulating layer 114 on the substrate 100 may serve as an insulating pattern 114a to provide insulation between an upper surface of the substrate 100 and lower surfaces of first and second gate electrodes 120 and 122 (e.g., refer to FIG. 9). The insulating layer 114 on the surfaces of the first and second active fin structures 106 and 108 may serve as a first gate insulating pattern 114b and a second gate insulating pattern 114c.

Referring to FIG. 9, the first gate electrode 120 may be on the first gate insulating pattern 114b and surround the first active fin structure 106. The second gate electrode 122 may be on the second gate insulating pattern 114c and surround the second active fin structure 108.

In some embodiments, to form the first and second gate electrodes 120 and 122, an electrode layer may be conformally formed on the insulating layer 114 (e.g., refer to FIG.

8) along the surfaces of the first and second active fin structures 106 and 108. Thereafter, a portion of the gate electrode layer may be etched by, for example, an anistropic etching process. In some embodiments, the first and second gate electrodes 120 and 122 may include polysilicon. The first and second gate electrodes 120 and 122 may have upper surfaces lower than upper surfaces of the first and second active fin structures 106 and 108 relative to the upper surface of the substrate 100.

Upper portion of the first and second active fin structures 106 and 108 may be doped with the first conductivity type impurity to form a first upper impurity region 124 and a second upper impurity region 126, respectively.

Figure 10:
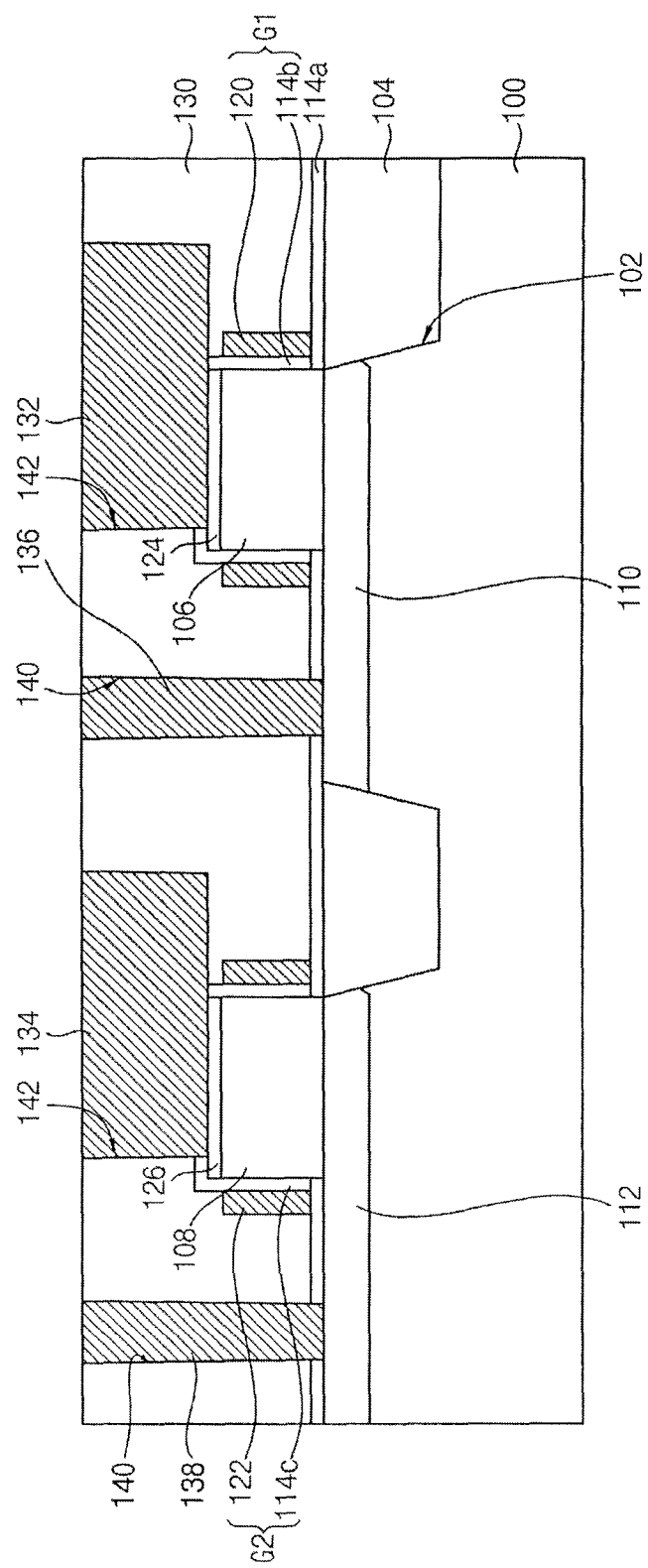

Referring to FIG. 10, a first interlayer insulating layer 130 may cover the first and second active fin structures 106 and 108. A first upper electrode 132, a second upper electrode 134, a first lower electrode 136, and a second lower electrode 138 may be formed to penetrate the first interlayer insulating layer 130.

In some embodiments, after forming the first interlayer insulating layer 130, a planarization process may be performed to planarize an upper surface of the first interlayer insulating layer 130. The planarization process may include, for example, a chemical mechanical polishing process and/or an etch back process.

In some embodiments, to form the first and second upper electrodes 132 and 134 and the first and second lower electrodes 136 and 138, a portion of the first interlayer insulating layer 130 may be etched to form first openings 140 that penetrate the first interlayer insulating layer 130 to expose the first and second lower impurity regions 110 and 112, respectively, in the substrate 100. Additionally, a portion of the first interlayer insulating layer 130 may be etched to form second openings 142 that penetrate the first interlayer insulating layer 130 to expose the first and second upper impurity regions 124 and 126, respectively, in the first and second active fin structures 106 and 108.

Thereafter, a conductive layer may be formed in the first and second openings 140 and 142. The conductive layer may include metal. The conductive layer may be planarized to expose the upper surface of the first interlayer insulating layer 130. Thus, the first and second lower electrodes 136 and 138 may be respectively formed in the first openings 140, and the first and second upper electrodes 132 and 134 may be respectively formed in the second openings 142.

Figure 11:
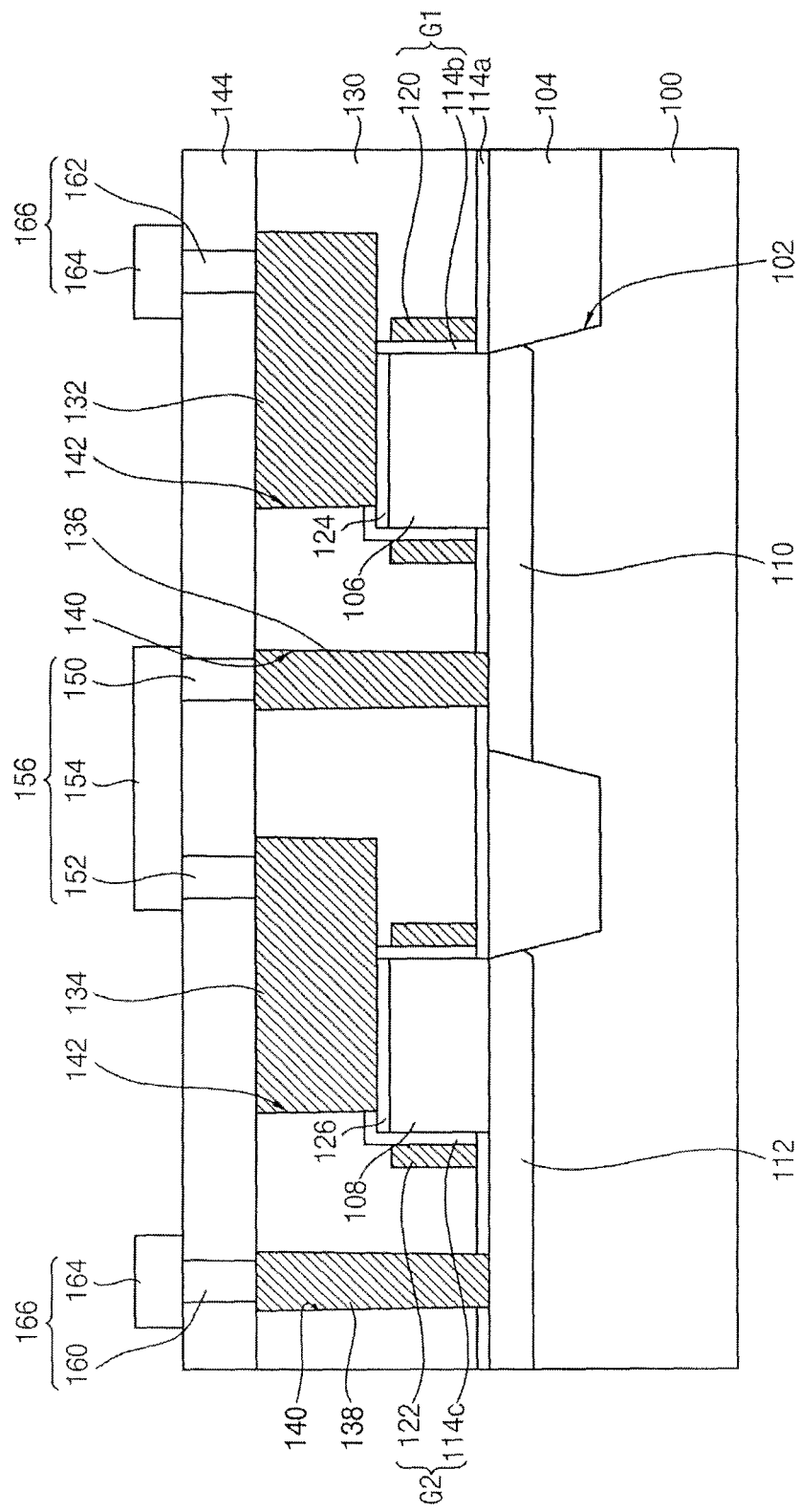

Referring to FIG. 11, a second interlayer insulating layer 144 may be formed on the first interlayer insulating layer 130, the first and second lower electrodes 136 and 138, and the first and second upper electrodes 132 and 134.

A first interconnection structure 156 may penetrate the second interlayer insulating layer 144 and electrically connect the first lower electrode 136 and the second upper electrode 134. A second interconnection structure 166 may penetrate the second interlayer insulating layer 144 and electrically connect the first upper electrode 132 and the second lower electrode 138.

In some embodiments, the first interconnection structure 156 may include a first contact plug 150 contacting an upper surface of the first lower electrode 136, a second contact plug 152 contacting an upper surface of the second upper electrode 134, and a first conductive pattern 154 connecting upper surfaces of the first and second contact plugs 150 and 152. The second interconnection structure 166 may include a third contact plug 160 contacting an upper surface of the second lower electrode 138, a fourth contact plug 162 contacting an upper surface of the first upper electrode 132, and a second conductive pattern 164 connecting upper surfaces of the third and fourth contact plugs 160 and 162.

To form the first and second interconnection structures 156 and 166, a portion of the second interlayer insulating layer 144 may be etched to form first to fourth contact holes penetrating the second interlayer insulating layer 144 and exposing the first lower electrode 136, the second upper electrode 134, the second lower electrode 138, and the first upper electrode 132, respectively. A conductive layer may be formed in the first to fourth contact holes. The conductive layer may include metal. The conductive layer may be planarized to expose an upper surface of the second interlayer insulating layer 144. Thus, the first to fourth contact plugs 150, 152, 160, and 162 may be formed on the first to fourth contact holes, respectively. The first conductive pattern 154 connecting the upper surfaces of the first and second contact plugs 150 and 152 and the second conductive pattern 164 connecting the upper surfaces of the third and fourth contact plugs 160 and 162 may be formed on the second interlayer insulating layer 144.

In some embodiments, the first and second conductive patterns 154 and 164 may be formed by forming a conductive layer on the second interlayer insulating layer 144 and then patterning the conductive layer by a photo-etching process. In some embodiments, the first and second conductive patterns 154 and 164 may be formed by a damascene process. For example, a third interlayer insulating layer may be formed on the second interlayer insulating layer 144. A portion of the third interlayer insulating layer may be etched to form a first trench exposing together the upper surfaces of the first and second contact plugs 150 and 152 and a second trench exposing together the upper surfaces of the third and fourth contact plugs 160 and 162. A conductive layer may be formed in the first and second trenches and may be planarized to form the first and second conductive patterns 154 and 164.

The semiconductor device illustrated in FIGS. 1 to 4 may be manufactured by the above-described processes.

Figure 12:
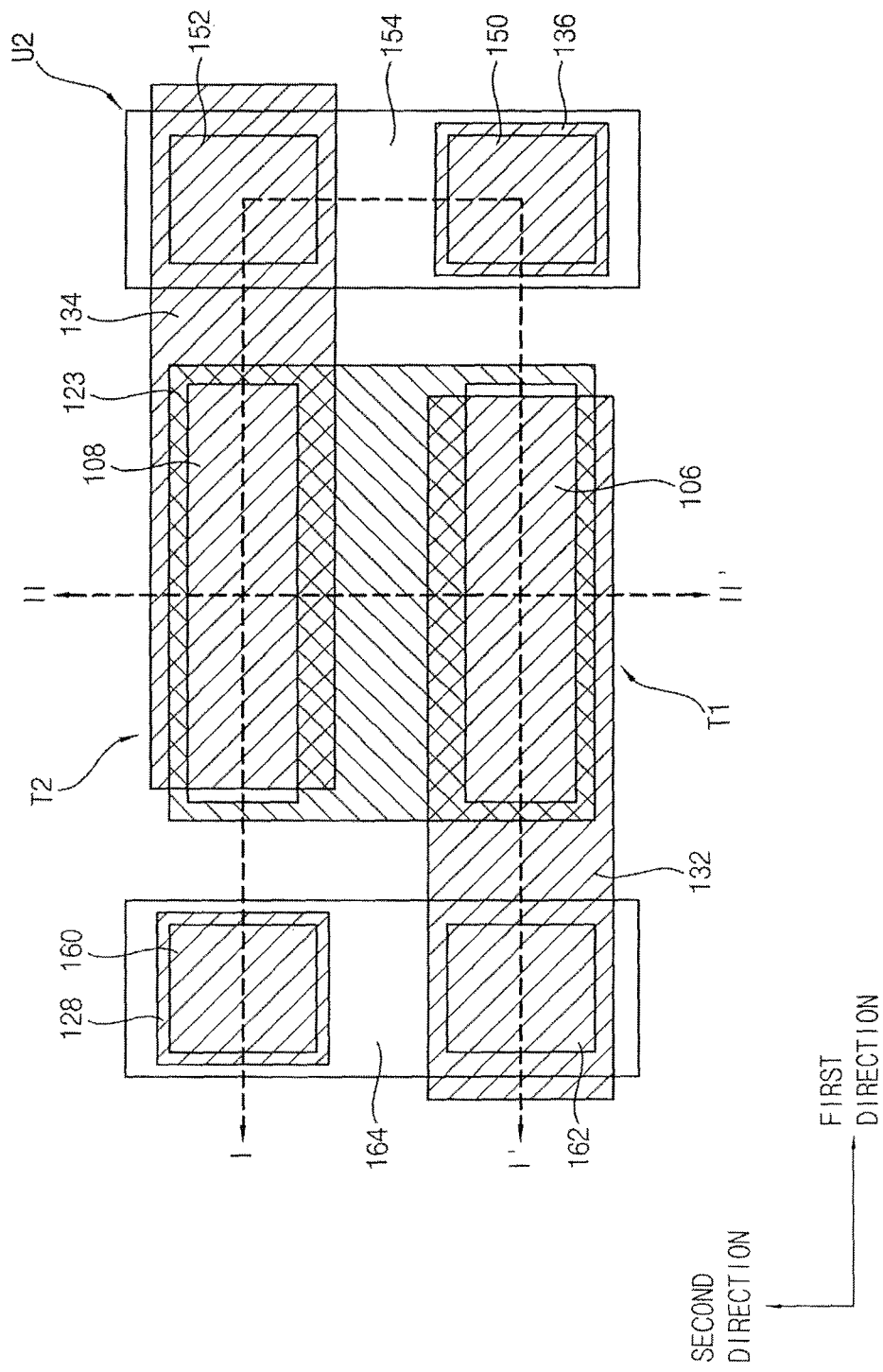
FIGS. 12 and 13 illustrate another embodiment of a semiconductor device.
Figure 13:
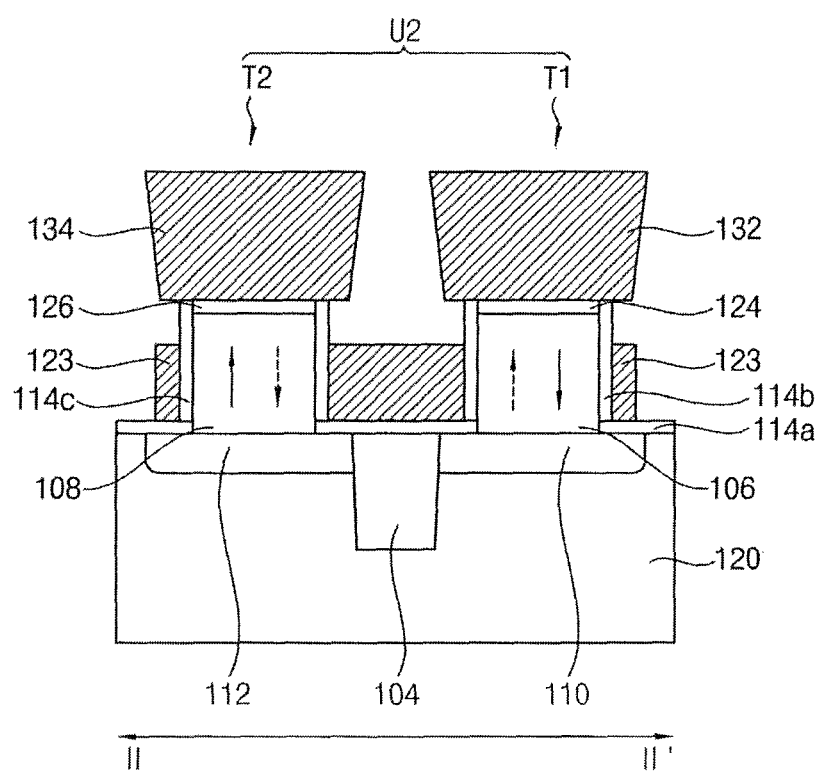

FIGS. 12 and 13 are plan and cross-sectional views illustrating another embodiment of a semiconductor device. FIG. 13 is a cross-sectional view taken along line II-II' in FIG. 12. A cross-sectional view taken along line I-I' of FIG. 12 may be the same as FIGS. 3A and 3B. An equivalent circuit diagram of the semiconductor device shown in FIGS. 12 and 13 may be substantially the same as the equivalent circuit in FIGS. 5A and 5B.

Referring to FIGS. 12 and 13, a vertical transistor unit U2 functioning as one transistor may be on a substrate 100. The vertical transistor unit U2 may include a first vertical transistor T1 and a second vertical transistor T2. The vertical transistor unit U2 may be substantially the same as the vertical transistor unit U1 in FIGS. 1 to 5, except that the first and second vertical transistors T1 and T2 include a common gate electrode 123.

A first active fin structure 106 and a second active fin structure 108 that protrude from the substrate 100 may be on the substrate 100.

The first vertical transistor T1 may include a gate structure, a first lower impurity region 110, a first upper impurity region 124, a first lower electrode 136, and a first upper electrode 132. The second vertical transistor T2 may include the gate structure, a second lower impurity region 112, a second upper impurity region 126, a second lower electrode 138, and a second upper electrode 134.

The gate structure may surround the first and second active fin structures 106 and 108 together. The gate structure may include a first gate insulating pattern 114*b* that surrounds a sidewall of the first active fin structure 106, a second gate insulating pattern 114c that surrounds a sidewall of the second active fin structure 108, and the common gate electrode 123 that is disposed on the first and second gate insulating patterns 114b and 114c and surrounds the first and second active fin structures 106 and 108 together. The common gate electrode 123 may fill at least a portion of a space between the first and second active fin structures 106 and 108 in the second direction. A lower surface of the common gate electrode 123 may be spaced apart from an upper surface of the substrate 100.

The first interconnection structure in FIGS. 1 to 4 may be on the substrate 100 to electrically connect the first lower electrode 136 and the second upper electrode 134. The second interconnection structure in FIGS. 1 to 4 may be on the substrate 100 to electrically connect the second lower electrode 138 and the first upper electrode 132.

Figure 14:
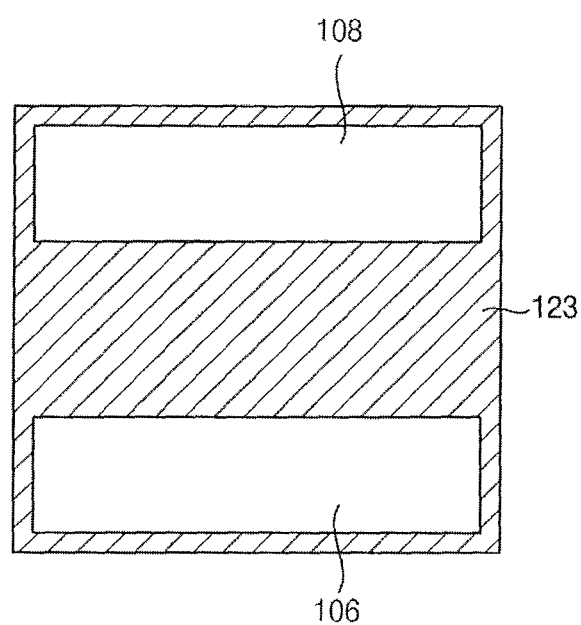
FIG. 14 illustrates another embodiment of a method for manufacturing a semiconductor device.

FIG. 14 is a plan view illustrating another embodiment of a method for manufacturing a semiconductor device. The semiconductor device shown in FIG. 14 may be, for example, the semiconductor device in FIGS. 12 and 13.

Referring to FIG. 14, the same processes described in FIGS. 7 and 8 may be performed. A common gate electrode 123 surrounding the first and second active fin structures 106 and 108 together may be formed on the first and second gate insulating patterns 114b and 114c (e.g., refer to FIG. 8).

In some embodiments, to form the common gate electrode 123, a gate electrode layer may be formed on the insulating layer 114 (e.g., refer to FIG. 8) to entirely fill between the first and second active fin structures 106 and 108. The gate electrode layer may be patterned, for example, by a photo-etch process to form the common gate electrode 123 surrounding the first and second active fin structures 106 and 108 together. In the photo-etch process, a mask pattern covering the first and second active fin structures 106 and 108 may be used.

An upper surface of the common gate electrode 123 may be lower than upper surfaces of the first and second active fin structures 106 and 108 relative to an upper surface of the substrate 100. Upper portions of the first and second active fin structures 106 and 108 exposed by the common gate electrode 123 may be doped with a first conductivity type impurity to form a first upper impurity region and a second upper impurity region, respectively, similar to the first and second upper impurity regions 124 and 126 in FIG. 9.

Thereafter, the same processes as in FIGS. 10 and 11 may be performed to manufacture the semiconductor device in FIGS. 12 and 13.

Figure 15:
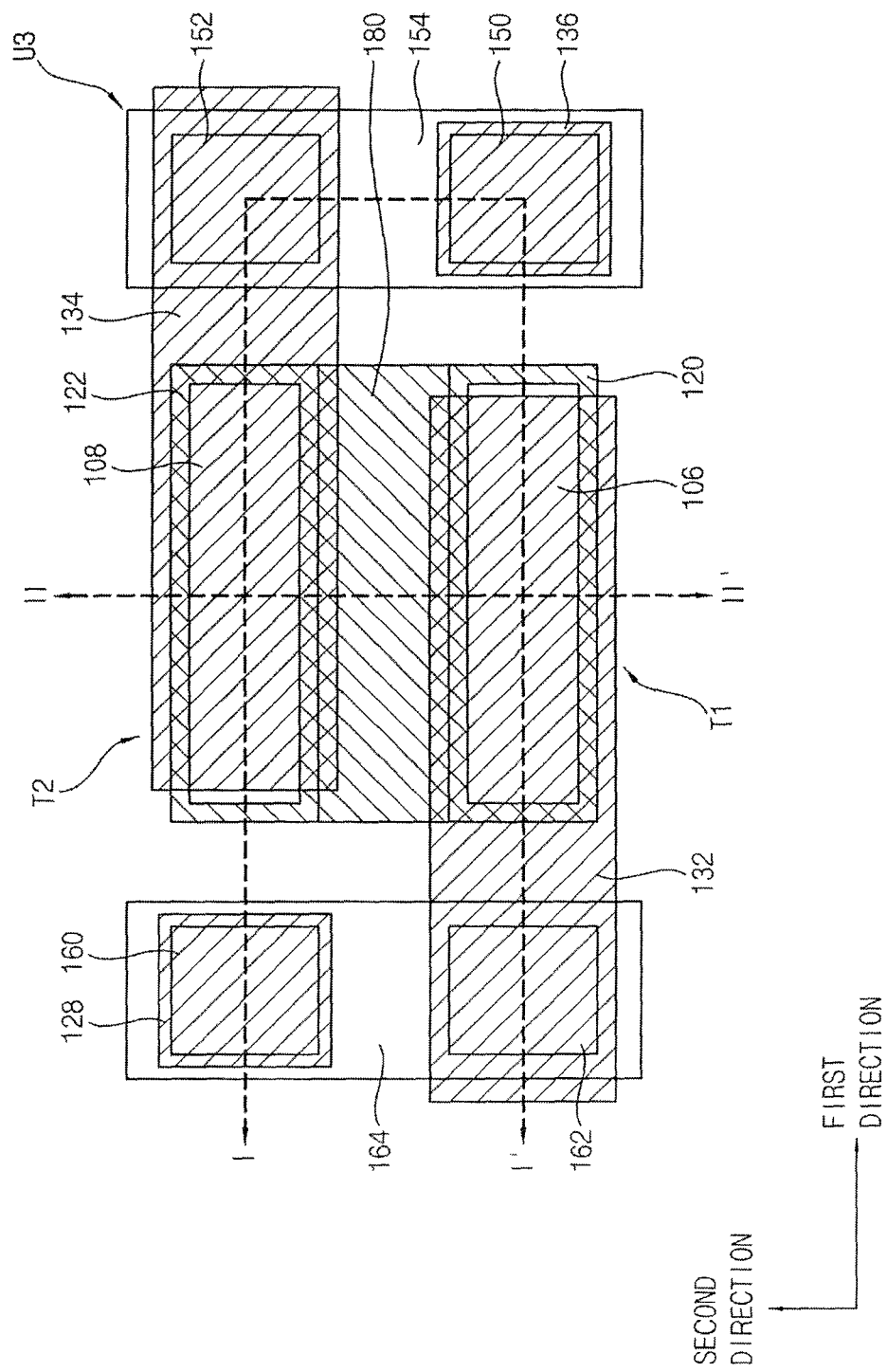
FIGS. 15 and 16 illustrate another embodiment of a semiconductor device.
Figure 16:
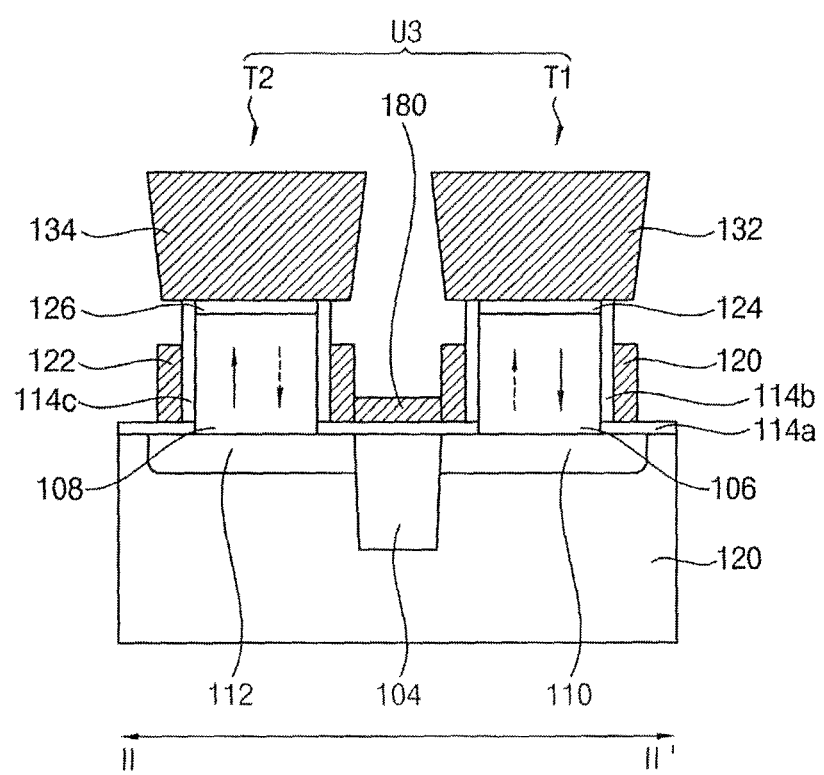

FIGS. 15 and 16 are a plan view and a cross-sectional view illustrating another embodiment of semiconductor device. FIG. 16 illustrates a cross-sectional view taken along line II-II' in FIG. 15. A cross-sectional view taken along line I-I' in FIG. 15 may be the same as FIGS. 3A and 3B. An equivalent circuit diagram of a semiconductor device in FIGS. 15 and 16 may be substantially the same as the equivalent circuit diagrams in FIGS. 5A and 5B.

Referring to FIGS. 15 and 16, a vertical transistor unit U3 may be disposed to function as one transistor. The vertical transistor unit U3 may include a first vertical transistor T1 and a second vertical transistor T2. The vertical transistor unit U3 may be substantially the same as the vertical transistor unit U1 in FIGS. 1 to 5, except for a connection pattern 180 connecting first and second gate electrodes 120 and 122.

The connection pattern 180 may be between mutually facing lower sidewalls of the first and second gate electrodes 120 and 122 in the second direction to connect the first and second gate electrodes 120 and 122 to each other. In some embodiments, ends of the connection pattern 180 in the first direction may be parallel to ends of the first and second gate electrodes 120 and 122 in the first direction. In some embodiments, the first and second gate electrodes 120 and 122 and the connection pattern 180 may be integrally coupled to one another.

To manufacture the semiconductor device shown in FIGS. 15 and 16, the same processes in FIGS. 7 and 8 may be performed.

Thereafter, a first gate electrode 120 and a second gate electrode 122 may be formed on the first and second gate insulating patterns 114b and 114c, respectively, to surround the first active fin structure 106 and the second active fin structure 108, respectively. A connection pattern 180 may be formed to connect between lower sidewalls of the first and second gate electrodes 120 and 122.

In some embodiments, a gate electrode layer may be conformally formed on the insulating layer 114 (e.g., refer to FIG. 8) along surfaces of the substrate 100 and sidewalls of the first and second active fin structures 106 and 108. The gate electrode layer may be patterned by a photo-etch process to form the first and second gate electrodes 120 and 122 and the connection pattern 180. In the photo-etch process, a mask pattern covering upper surfaces of the first and second active fin structures 106 and 108 may be used.

Thereafter, the same processes in FIGS. 10 and 11 may be performed. Thus, the semiconductor device in FIGS. 15 and 16 may be manufactured.

Figure 17:
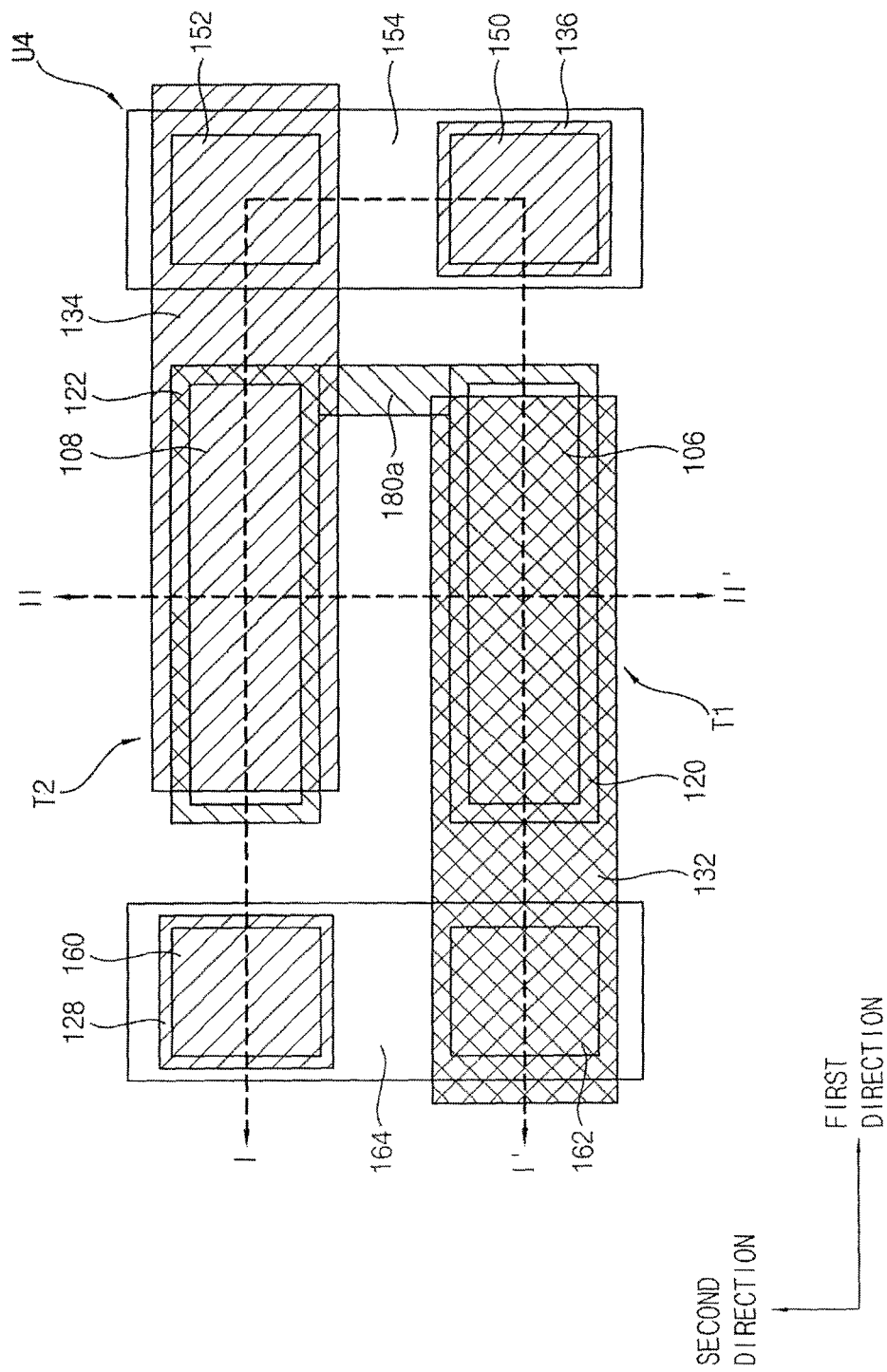
FIG. 17 illustrates another embodiment of a semiconductor device.

FIG. 17 is a plan view illustrating another embodiment of a semiconductor device. An equivalent circuit diagram of the semiconductor device in FIG. 17 may be substantially the same as the equivalent circuit diagrams in FIGS. 5A and 5B.

Referring to FIG. 17, a vertical transistor unit U4 functioning as one transistor may be disposed on a substrate. The vertical transistor unit U4 may include a first vertical transistor T1 and a second vertical transistor T2. The vertical transistor unit U4 may be substantially the same as the vertical transistor unit U3 in FIGS. 15 and 16, except for a shape of a connection pattern 180a.

The connection pattern 180a may connect a first gate electrode 120 and a second gate electrode 122 and may be between portions of mutually facing lower sidewalls of the first and second gate electrodes 120 and 122. In some embodiments, the first and second gate electrodes 120 and 122 and the connection pattern 180a may be integrally coupled to one another.

A plurality of respective vertical transistor units U1 to U4 according to the example embodiments may are connected in parallel or in series.

Figure 18:
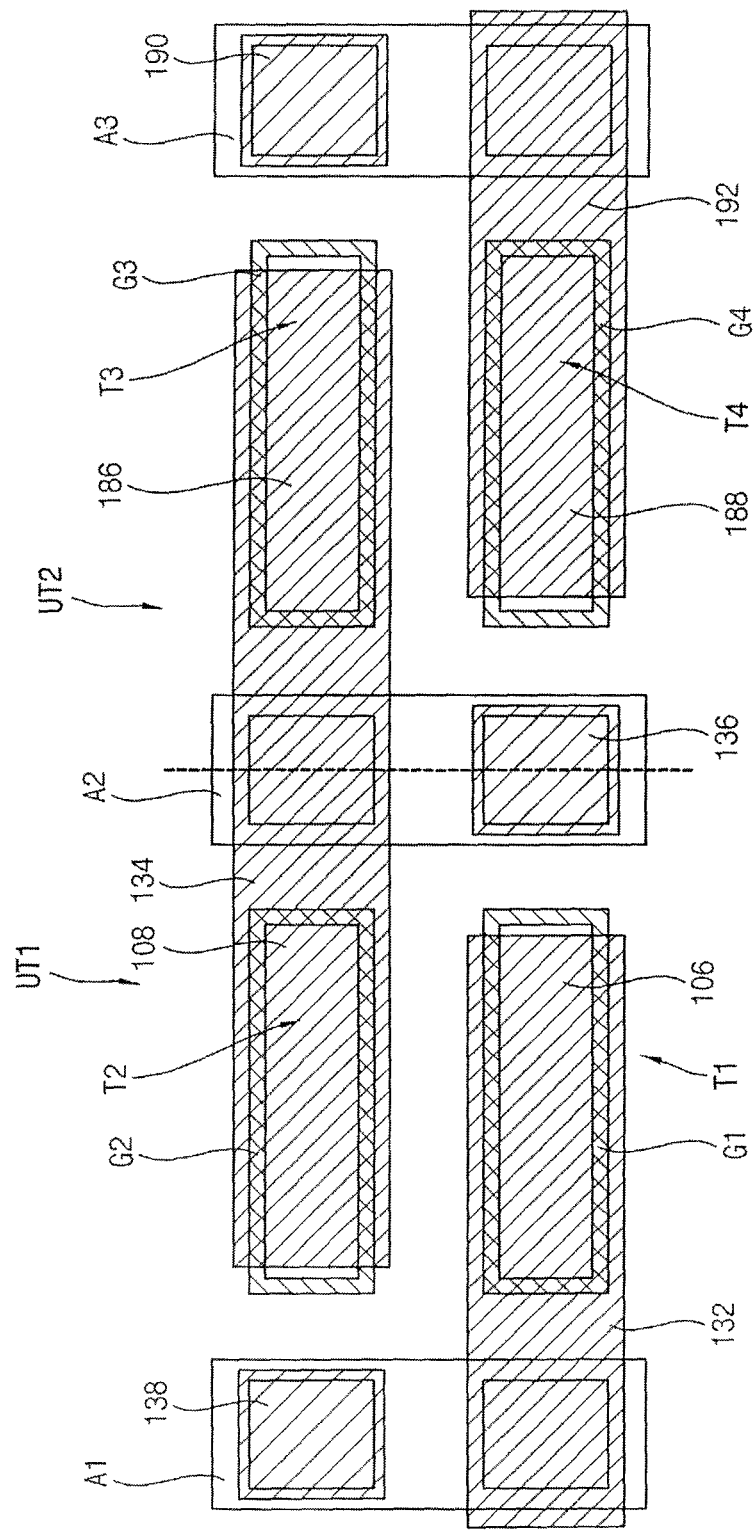
FIG. 18 illustrates another embodiment of a semiconductor device.
Figure 19:
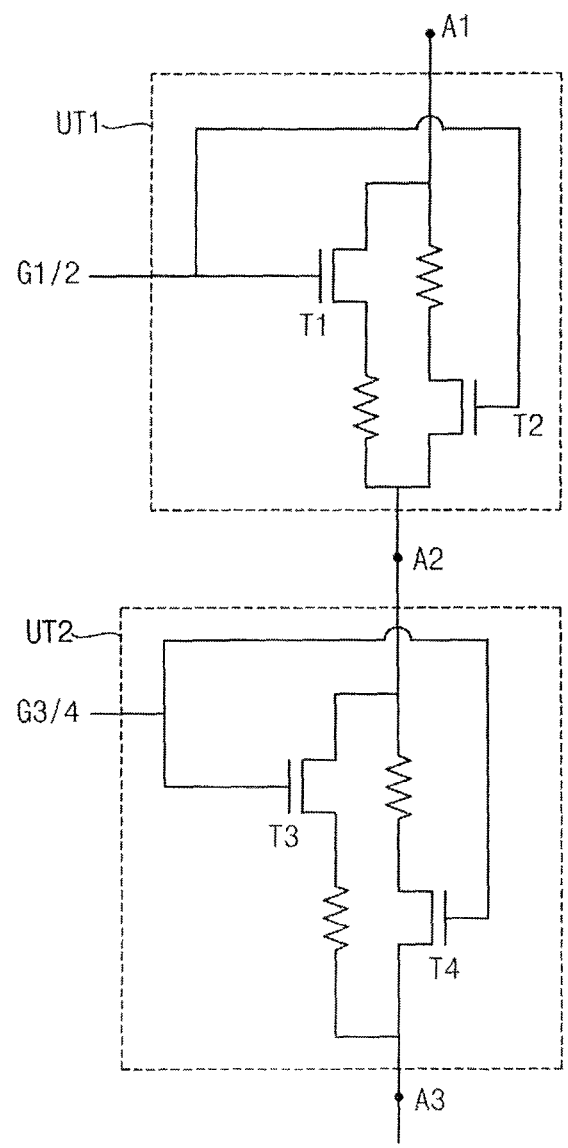
FIG. 19 illustrates another circuit embodiment of a semiconductor device.

FIG. 18 is a plan view illustrating another embodiment of a semiconductor device. FIG. 19 is an equivalent circuit embodiment of the semiconductor device of FIG. 18. A vertical transistor unit in the semiconductor device of FIGS. 18 and 19 may have substantially the same structure as the vertical transistor unit in FIGS. 1 to 5B. The semiconductor device may include a plurality of the vertical transistors connected in series.

Referring to FIGS. 18 and 19, a first vertical transistor unit UT1 functioning as one transistor may be on a substrate. A second vertical transistor unit UT2 having substantially the same structure as the first vertical transistor unit UT1 may be on the substrate.

The first vertical transistor unit UT1 may include a first vertical transistor T1 and a second vertical transistor T2. The second vertical transistor unit UT2 may include a third vertical transistor T3 and a fourth vertical transistor unit T4.

The first and second vertical transistors T1 and T2 may be on a first and second active fin structures 106 and 108, respectively, and on the substrate. The first vertical transistor T1 may include a first gate structure G1, a first lower impurity region, a first upper impurity region, a first lower electrode 136 and a first upper electrode 132 as in FIGS. 1 to 4. The second vertical transistor T2 may include a second gate structure G2, a second lower impurity region, a second upper impurity region, a second lower electrode 138, and a second upper electrode 134 as in FIGS. 1 to 4.

The third and fourth vertical transistors T3 and T4 may be on third and fourth active fin structures 186 and 188, respectively, and on the substrate.

The first lower impurity region, the second upper electrode 134 and the first lower electrode 136 may be commonly used for the third and fourth vertical transistors T3 and T4.

The third vertical transistor T3 may include a third gate structure G3, a third impurity region, a third lower electrode 190, a third upper impurity region, and the second upper electrode 134. The second upper electrode 134 may extend in the first direction to contact an upper surface of the third active fin structure 186.

The fourth vertical transistor T4 may include a fourth gate structure G4, the first lower impurity region, the first lower electrode 136, a fourth upper impurity region, and a third upper electrode 192. The first lower impurity region may extend in the first direction to face a lower surface of the fourth active fin structure 188.

A first interconnection structure A1 may electrically connect the first upper electrode 132 and the second lower electrode 138. The first interconnection structure A1 may be connected to the first and second vertical transistors T1 and T2. A second interconnection structure A2 may electrically connect the first lower electrode 136 and the second upper electrode 134. The second interconnection structure A2 may be commonly connected to the first to the fourth vertical transistors units T1 to T4. A third interconnection structure A3 may electrically connect the third upper electrode 192 and the third lower electrode 190. The third interconnection structure A3 may be connected to the third and fourth vertical transistors T3 and T4.

In some embodiments, the first lower electrode 136 and the second upper electrode 134 may be a drain electrode D, and the third lower electrode 190 and the third upper electrode 192 may be a source electrode S. In this case, drain current may flow from the second vertical transistor unit UT2 to first vertical transistor unit UT1.

Conversely, the first lower electrode 136 and the second upper electrode 134 may be the source electrode S and the third lower electrode 190 and the third upper electrode 192 may be the drain electrode D. In this case, drain current may flow from the first vertical transistor unit UT1 to second vertical transistor unit UT2.

The first and second vertical transistor units UT1 and UT2 may have the same operating characteristics depending on the current direction. Therefore, operating characteristics may be the same (e.g., the output drain current may lie within a predetermined tolerance based on, for example, the intended application of the transistor structure or the requirements of a host circuit or device) irrespective of the direction of current flow, even in a structure where first and second vertical transistor units UT1 and UT2 are connected in series.

The semiconductor device according to the example embodiments described herein may be used, for example, for a memory device or a logic device, which includes transistors.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
    a first active fin structure and a second active fin structure on a substrate;
    a first gate structure on a sidewall of the first active fin structure;
    a second gate structure on a sidewall of the second active fin structure;
    a first lower electrode on the substrate on a side of the first active fin structure, the first lower electrode spaced apart from the first active fin structure;
    a first upper electrode on an upper surface of the first active fin structure;
    a second lower electrode on the substrate on a side of the second active fin structure, the second lower electrode spaced apart from the second active fin structure;
    a second upper electrode on an upper surface of the second active fin structure;
    a first interconnection structure connecting the first lower electrode and the second upper electrode; and
    a second interconnection structure connecting the second lower electrode and the first upper electrode, wherein:
    when the semiconductor device operates, a drain current flow direction through the first active fin structure is opposite to a drain current flow direction through the second active fin structure.

2. The semiconductor device as claimed in claim 1, wherein the first and second active fin structures extend in a first direction and are spaced apart from each other in a second direction crossing the first direction.

3. The semiconductor device as claimed in claim 2, wherein the first and second lower electrodes are spaced from the first and second active fin structures, respectively, in the first direction and are arranged in an oblique direction relative to the second direction.

4. The semiconductor device as claimed in claim 2, wherein:
    the first and second upper electrodes extend in the first direction,
    a portion of the first upper electrode and the second lower electrode are arranged in a first line parallel to the second direction, and
    a portion of the second upper electrode and the first lower electrode are arranged in a second line parallel to the second direction.

5. The semiconductor device as claimed in claim 1, wherein upper surfaces of the first lower electrode, the first upper electrode, the second lower electrode, and the second upper electrode are substantially coplanar with one another.

6. A semiconductor device, comprising:
a first active fin structure and a second active fin structure on a substrate;
a first gate structure on a sidewall of the first active fin structure;
a second gate structure on a sidewall of the second active fin structure;
a first lower electrode on the substrate on a side of the first active fin structure, the first lower electrode spaced apart from the first active fin structure;
a first upper electrode on an upper surface of the first active fin structure;
a second lower electrode on the substrate on a side of the second active fin structure, the second lower electrode spaced apart from the second active fin structure;
a second upper electrode on an upper surface of the second active fin structure;
a first interconnection structure connecting the first lower electrode and the second upper electrode; and
a second interconnection structure connecting the second lower electrode and the first upper electrode, wherein:
the first interconnection structure includes a first contact plug contacting an upper surface of the first lower electrode, a second contact plug contacting an upper surface of the second upper electrode, and a first conductive pattern connecting the first and second contact plugs, and
the second interconnection structure includes a third contact plug contacting an upper surface of the second lower electrode, a fourth contact plug contacting an upper surface of the first upper electrode, and a second conductive pattern connecting the third and fourth contact plugs.

7. The semiconductor device as claimed in claim 6, wherein the first conductive pattern and the second conductive pattern extend in a direction crossing an extension direction of the first and second active fin structures.

8. The semiconductor device as claimed in claim 1, wherein:
the first gate structure includes a first gate insulating pattern on the sidewall of the first active fin structure and a first gate electrode on the first gate insulating pattern,
the second gate structure includes a second gate insulating pattern on the sidewall of the second active fin structure and a second gate electrode on the second gate insulating pattern, and
the first and second gate electrodes are electrically connected to each other.

9. The semiconductor device as claimed in claim 8, wherein the first and second gate electrodes are integrally coupled to each other and surround the first and second active fin structure, respectively.

10. The semiconductor device as claimed in claim 1, further comprising:
a first lower impurity region in the substrate and contacting the first lower electrode;
a second lower impurity region in the substrate and contacting the second lower electrode;
a first upper impurity region in an upper portion of the first active fin structure; and
a second upper impurity region in an upper portion of the second active fin structure.

11. The semiconductor device as claimed in claim 1, wherein the first interconnection structure serves as a source electrode or a drain electrode.

* * * * *